United States Patent
Amstutz et al.

(10) Patent No.: US 7,210,635 B2
(45) Date of Patent: *May 1, 2007

(54) SYSTEM AND METHOD FOR ENCAPSULATION AND PROTECTION OF COMPONENTS

(75) Inventors: Aaron K. Amstutz, Princeville, IL (US); Randall G. Sommer, Sparland, IL (US); Thomas J Grabenstetter, Metamora, IL (US); Christopher J. Stickling, Dunlap, IL (US)

(73) Assignee: Caterpillar Inc, Peoria, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/034,081

(22) Filed: Jan. 12, 2005

(65) Prior Publication Data

US 2006/0000916 A1    Jan. 5, 2006

Related U.S. Application Data

(62) Division of application No. 10/884,722, filed on Jul. 2, 2004.

(51) Int. Cl.
*G06K 19/06*    (2006.01)

(52) U.S. Cl. .................. 235/492; 235/487
(58) Field of Classification Search ........... 235/492, 235/487; 428/68, 71, 76
See application file for complete search history.

(56) References Cited

U.S. PATENT DOCUMENTS

| | | | |
|---|---|---|---|
| 4,008,198 A | | 2/1977 | Krohberger et al. |
| 4,163,072 A | | 7/1979 | Soos |
| 5,500,065 A | * | 3/1996 | Koch et al. .................. 156/123 |
| 5,673,179 A | * | 9/1997 | Horejs et al. ................ 361/737 |
| 5,682,296 A | * | 10/1997 | Horejs et al. ................ 361/737 |
| 5,952,065 A | * | 9/1999 | Mitchell et al. ........... 428/35.4 |
| 6,025,054 A | * | 2/2000 | Tiffany, III .................. 428/189 |
| 6,031,459 A | * | 2/2000 | Lake ........................ 340/572.8 |
| 6,140,697 A | * | 10/2000 | Usami et al. ................ 257/679 |
| 6,241,153 B1 | * | 6/2001 | Tiffany, III .................. 235/488 |
| 6,688,353 B1 | * | 2/2004 | Koch ........................ 152/152.1 |
| 6,765,286 B1 | * | 7/2004 | Morimura et al. .......... 257/684 |
| 2003/0204019 A1 | | 10/2003 | Ding et al. |
| 2004/0043515 A1 | | 3/2004 | Goller et al. |

* cited by examiner

*Primary Examiner*—Kimberly D. Nguyen
(74) *Attorney, Agent, or Firm*—Kevin C. Earle; Richard K. Chang

(57) ABSTRACT

An apparatus and method for providing a radio frequency identification. A barrier system is adapted to encase at least a portion of a radio frequency identification device. The barrier system includes a first layer defining a first set of physical properties and a second layer defining a second set of physical properties. A continuous transitory material is formed between the first and the second layers where they are interlinked at associated first and second margin portions. The physical properties of each layer of the barrier system provide protection to the component assembly from various types of physical and environmental damage.

29 Claims, 2 Drawing Sheets

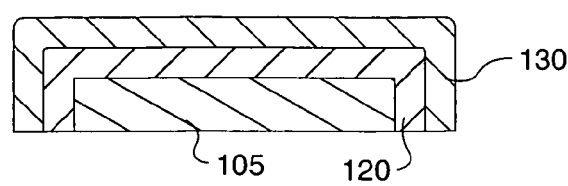
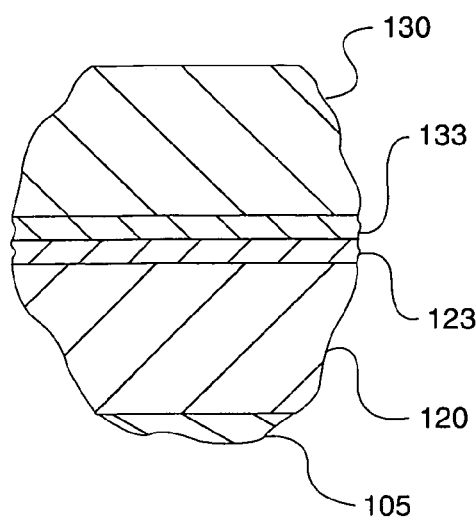
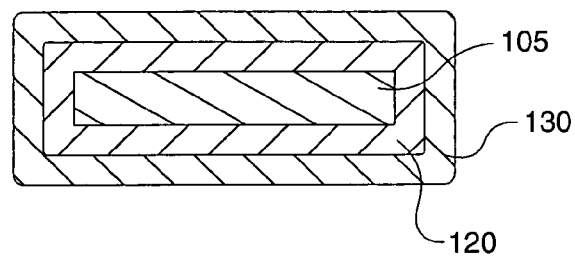
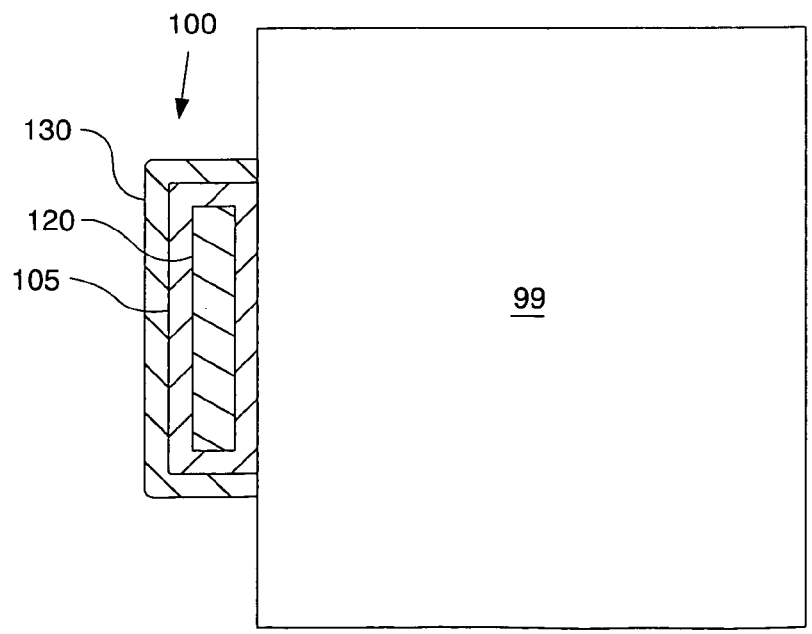

SYSTEM AND METHOD FOR ENCAPSULATION AND PROTECTION OF COMPONENTS

This application is a divisional of U.S. patent application Ser. No. 10/884,722 filed on Jul. 2, 2004.

TECHNICAL FIELD

The present invention relates generally to a system and method for encapsulating and protecting a component assembly and, more particularly, to a system and method that uses elastomers to protectively surround and encase at least a portion of the component assembly.

BACKGROUND

It is often necessary to protect sensitive component assemblies, such as circuit boards, from damage due to the environments in which they are being used. Since the electrical components that reside on the surface of these circuit boards are particularly sensitive, damage to these components can result from contamination and corrosion due to dirt, dust, moisture, mildew, or other penetrants such as diesel fuel, etc. coming into contact therewith. Also, physical damage to the electrical component may occur due to direct impact, vibrations, abrasion, handling, etc.

It is known to encapsulate electrical components. For instance, encapsulation to protectively surround a component has traditionally been achieved by encasing the component with a hard polymeric casing and thereafter using silicone, polyurethane, epoxy, or hot melt adhesive to encase the component within the hard casing. The polyurethane or epoxy encapsulating materials are typically injected into the casing at a low pressure to surround the electronics and then is cured in place to position the electronics within the casing.

A problem with known encapsulation methods includes the corrosion or degradation of the sensitive electrical components when moisture penetrates the encapsulant and contacts the components. Moreover, in applications when the component assembly is subject to vibration, the electrical components may debond from the encapsulant. This results in an entry being created for moisture or debris within the encapsulant.

Another problem with the traditionally manufactured assemblies includes providing a sealed, hard outer casing, which is often the most expensive constituent of the package. Further, the hard casing design is usually manufactured by first creating a series of molds that are significantly expensive and not subject to easy design modification. Also, during the assembly process there are multiple steps required to position and encapsulate the component to the casing at additional added expense.

One such example of a known component assembly is disclosed by U.S. Pat. No. 5,755,026. A plastic foam is formed to a desired shape to surround the components. Unfortunately, multiple steps are required to form such an enclosure and the foam filler does not offer enough protection from contamination or impact.

Another example of a component assembly is disclosed by U.S. Pat. No. 5,736,190 is more complex method of fighting moisture and debris, using a reaction of two oligomers to create a cured co-polymer layer around an electrical component. However, this patent is directed at being a moisture barrier and does not provide for any protection from physical damages or impacts that could occur to the component.

Another example of a component assembly is disclosed by U.S. Pat. No. 6,458,628 which discloses a semiconductor chip attachment with a dielectric layer. The dielectric layer is attached to the semiconductor with a thixotropic fluid that is cured to form an encapsulant. Unfortunately, there are multiple steps required to form the dielectric layer and subsequently attach it to the semiconductor chip.

Another known encapsulation assembly is disclosed by U.S. Pat. No. 6,439,698 which discloses a method for creating a dual function encapsulating material. The disclosed epoxy material has two cure mechanisms. After the material is applied to the electrical connections, a first cure is initiated by radiation to crosslink the epoxy materials and encapsulate the electrical connections. Then a second cure is performed with heat to adhere the electrical connections to the body of a cartridge. However, the process by which the materials are joined tends to be time consuming resulting in a multiple step process which is expensive to implement.

SUMMARY OF THE INVENTION

It is to be understood that both the foregoing general description and the following detailed description are exemplary and explanatory only and are not restrictive of the invention as claimed.

One aspect of the present disclosure is directed to an apparatus for providing a radio frequency identification (RFID). The apparatus comprises a RFID device and a barrier system adapted to encase at least a portion of the RFID component assembly. The barrier system includes a first layer defining a first set of physical properties and including a first margin portion and a second layer defining a second set of physical properties and including a second margin portion, the first margin portion being interlinked to the second margin portion to form continuous transitory material therebetween.

Another aspect of the present disclosure is directed to a method for manufacturing an apparatus for providing a RFID. This method comprises constructing a RFID device configured to transmit a radio frequency transparently, arranging a barrier system around the RFID device to encase at least a portion of the RFID device, interlinking a first layer and a second layer of the barrier system, and causing the first layer and the second layer to conform to the shape of the RFID device.

Another aspect of the present disclosure is directed to a method for protecting a RFID device from environmental and physical impact. This method comprises arranging a barrier system to encase at least a portion of the RFID device, interlinking a first layer with a second layer of the barrier system, and causing the first layer and the second layer to conform to the shape of the RFID device.

Another aspect of the present disclosure is directed to an item having a RFID device attached. The RFID device comprises a barrier system adapted to encase at least a portion of the RFID device. The barrier system includes a first layer defining a first set of physical properties and including a first margin portion, and a second layer defining a second set of physical properties and including a second margin portion. The first margin portion is interlinked to the second margin portion to form a continuous transitory material therebetween.

Another aspect of the present disclosure is directed to a method for protecting a RFID device. The RFID device has a first layer defining a first set of physical properties and including a first margin portion and a second layer defining a second set of physical properties and including a second margin portion. The first margin portion is interlinked to the second margin portion to form a continuous transitory material therebetween. The method comprises the second layer receiving an impact and the first layer responsively absorbing the vibration and movement of the second layer into the first layer.

BRIEF DESCRIPTION OF THE DRAWINGS

The accompanying drawings, which are incorporated in and constitute a part of this specification, illustrate several exemplary embodiments of the invention and, together with the description, serve to explain the principles of the invention. In the drawings.

FIG. 3 is a close-up view of the interlinked layers of the cross-sectional view of the exemplary embodiment of the component protection package shown in FIG. 2;

FIG. 4 is a cross-sectional view of a second embodiment of a component protection package according to the present disclosure;

FIG. 5 is a cross-sectional view of a third embodiment of a component protection package according to the present disclosure; and FIG. 6 is a cross sectional view of a component protection package according to one embodiment of the present disclosure attached to a machine.

DETAILED DESCRIPTION

Reference will now be made in detail to embodiments of the invention, examples of which are illustrated in the accompanying drawings. Whenever possible, the same reference numbers will be used throughout the drawings to refer to the same or like parts.

Figure 1:
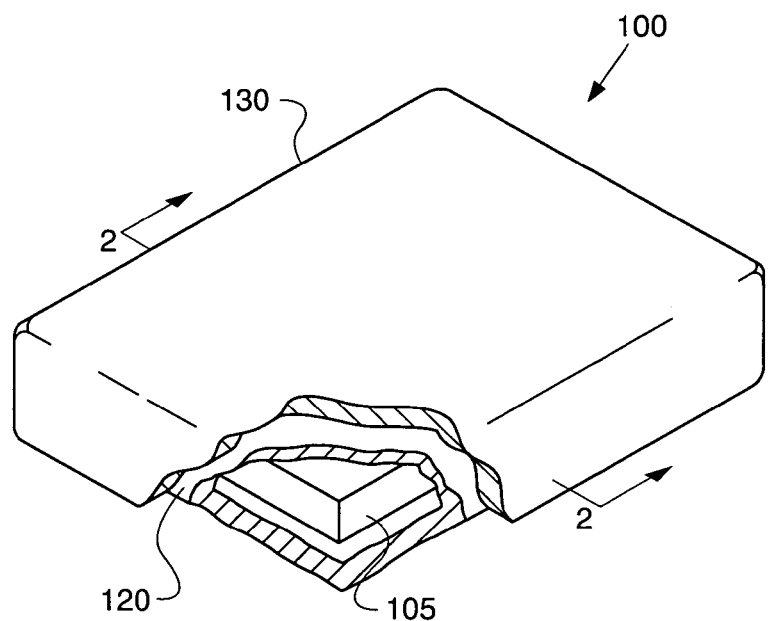
FIG. 1 is a perspective view of an exemplary embodiment of a component protection package according to the present disclosure with a cutaway portion to show the encased component assembly.

FIG. 1 illustrates a component protection package consistent with an exemplary embodiment of the present disclosure, which is generally designated by 100. The component protection package 100 includes a barrier system 110 surrounding a component assembly 105 such as a circuit board, for example. However, the component assembly 105 may be any number of items that could be subject to harsh environments and impacts or vibrations.

Figure 2:
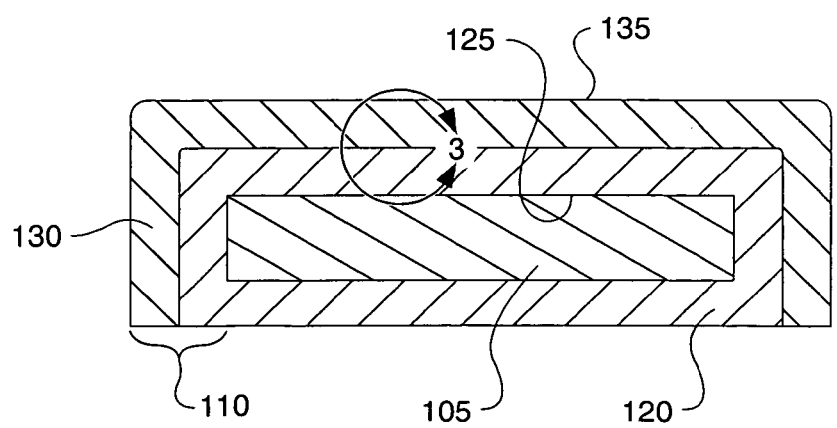
FIG. 2 is a cross-sectional view of the exemplary embodiment of the component protection package shown in FIG. 1.

FIG. 2 is a cross-sectional view of the exemplary embodiment of the component protection package shown in FIG. 1. Referring to FIG. 2, the barrier system 110 includes a first layer 120 that may be overlayed, at least in part, by a second layer 130. The barrier system also comprises an inner surface 125 that may contact the component assembly 105 and an outer surface 135. The first layer 120 that has been adapted to surround the component assembly 105 generally has a pliable structure. The inner surface 125 of the barrier system 110 may generally be in contact with the component assembly 105 and may be physically or chemically bonded to the component assembly 105. The structure of the second layer 130 that may overlay the first layer 120 may generally be rigid and the outer surface 135 may constitute a hard outer shell of the barrier system 110.

FIG. 3 is a close-up view of the interlinked layers of the cross-sectional view of the exemplary embodiment of the component protection package shown in FIG. 2. Referring to FIG. 3, the first layer 120 includes a first margin portion 123 that comes into contact with the second margin portion 133 of the second layer 130. The first margin portion 123 of the first layer 120 may be interlinked to the second margin portion 133 of the second layer 130 such that the layers are not prone to delamination. This is generally because of a continuous transitory material that may be formed where the first margin portion 123 of the first layer 120 interlinks with the second margin portion 133 of the second layer 130. Together, the first layer 120 and the second layer 130 are structured and arranged to encase the component assembly 105.

These layers may generally be comprised of elastomers or similar materials that have the necessary structure and are capable of being interlinked together to encase the component assembly 105 and provide multiple degrees of protection to the component assembly 105. Proper selection of these materials may allow for the first margin portion 123 to be interlinked to the second margin portion 133 such that the transitory material is formed having physical characteristics, different from that of the materials comprising the first layer 120 and the second layer 130.

In one possible embodiment using elastomers, the first layer 120 may comprise a first elastomer and the second layer 130 may comprise a second elastomer. The first elastomer may be formulated for low stiffness, lower than that of the second elastomer, to give it a pliable structure. The second elastomer may be formulated for a high stiffness, higher than that of the first elastomer, to create a rigid structure. The stiffness of elastomers and other similar materials may be measured using the material Shore hardness. The first elastomer may typically have a Shore A hardness between 25 and 60. The second elastomer may typically have a Shore D hardness between 35 and 80.

The second elastomer may generally be selected having a similar base elastomer to the first elastomer with a similar cross-linking agent. The cross-linking agent is what generally causes the molecules within the first elastomer to become irreversibly connected to the molecules in the second elastomer. The cross-linking agent is activated once it reaches its activation temperature and should be selected such that it has an activation temperature at a low enough temperature so that the temperature would not damage the chosen component assembly 105. The cross-linking agent may be, but is not limited to, peroxide based or sulfur based cross-linking agents.

One method of formulating the first elastomer is to use high plasticizer loadings in a lightly filled elastomer. One method for formulating the second elastomer is to use high filler loadings in an elastomer and thermoplastic polymer blend. The thermoplastic polymer should be chosen so that it is compatible with the elastomer and has a glass transition temperature below the cross-linking temperature of the formulation and below the desired maximum processing temperature. The thermoplastic polymer can be any one of a number of materials, such as thermoplastic epoxy, amorphous polyamide, styrenic, cellulosic, and non-crystalline polyesters, for example, or any other material known by those of ordinary skill in the art.

A variety of polymer combinations have also been found acceptable for the first elastomer and the second elastomer. A first combination of polymers could consist of using millable polyurethane with dioctylsebacate or aliphatic oil as a plasticizer for the first elastomer and millable polyurethane with thermoplastic epoxy for the second elastomer. Another combination of polymers could consist of using nitrile rubber with oligomeric polyisoprene as a plasticizer for the first elastomer and nitrile rubber with high temperature polyamide hot melt adhesive for the second elastomer. Another combination of polymers could consist of using nitrile rubber with oligomeric polyisoprene as a plasticizer for the first elastomer and nitrile PVC copolymer with additional PVC powder for stiffening and thermoplastic properties for the second elastomer. Although these three combinations are mentioned, the first elastomer and the second elastomer could comprise any number of combinations, and still be consistent with the present disclosure, where a compatible base elastomer is utilized.

Proper selection of materials may also enable various component assemblies 105 to be encased by the barrier system 110. For instance, when using radio frequency identification (RFID) devices, the materials chosen for the first layer 120 and the second layer 130 would be very important to their operation. In instances such as this, materials would need to be selected that are transparent to the transmission of those radio frequencies.

Although the barrier system 110 is structured and arranged about the component assembly 105 such that it is protectively surrounded, the component assembly 105 may also have such inherent rigidity and strength that it may increase the overall rigidity and strength of the barrier system 110. Depending on the size and shape of the component assembly 105 and where it is used, the barrier system 110, by incorporating the structure and functionality of the component assembly 105, may be more resilient to physical damage due to bending or impact.

FIGS. 4 and 5 are cross-sectional views of a second embodiment and a third embodiment of a component protection package 100. These component protection packages 100 differ from FIG. 2 in the degree to which the first layer 120 and the second layer 130 extend about the component assembly 105. FIG. 4 shows a component protection package with the barrier system 110 being structured and arranged about the component assembly 105 such that one side of the component assembly is not encased. FIG. 5 shows a component protection package where the first layer 120 is structured and arranged about the component assembly 105 on all sides and the second layer 130 is structured and arranged about the first layer 120 on all sides.

The present application contemplates various alternatives for the first and second layers, such as, for example, the first layer 120 and the second layer 130 may include distinct sub-layers designed for additional protection of the component assembly 105. These additional sub-layers may also be designated separately as an interlinked layer of the encapsulation system, or one of a plurality of layers designed for additional protection of the component assembly 105 such that there may be an additional generally pliable outer layer. Furthermore, each of the layers previously described are interchangeable such that the first layer 120 may be generally rigid while the second layer 130 may be generally pliable.

A method of creating a barrier system to protect a component therein comprises causing a first layer of the barrier system to be interlinked with a second layer of the barrier system and causing the first layer and the second layer to be molded so as to surround the component. After a component 105 is selected for encapsulation and protection, the materials and the processing method are selected. Selection of the materials and processing method may be done such that the first margin portion 123 of the first layer 120 may be interlinked to the second margin portion 133 of the second layer 130 and the inner surface 125 may be formed to the component assembly 105. The degree of protection and the amount of the component assembly 105 that will be encased may be determined based upon foreseeable use. This will enable the calendaring and pre-forming of the first layer 120 and the second layer 130 to protect the selected component assembly 105 with the predetermined degree of protection.

The first layer 120 may be adapted to protectively surround the component 105. The second layer 130 may be structured and arranged to encase the first layer 120 and the component assembly 105 as needed. Curing may then occur using one of a number of methods including, but not limited to applying heat, pressure, ultraviolet light, or other cure mechanism to the component protection package 100. Compression molding may be used to apply pressure and heat to the mold, but the molding and curing will depend upon the selected materials and their processing characteristics as well as a preferred geometry of the encapsulants. Other molding techniques to mold the layers may include, but is not limited to transfer molding and injection molding. Upon completion of the curing operation, the component protection package 100 may be removed from the mold. It may be necessary to establish a maximum processing temperature for the selected component assembly 105 to ensure that the materials and associated cure operation have a cure temperature that is not above the maximum allowable temperature of the component assembly 105 being protected.

INDUSTRIAL APPLICABILITY

The component protection package 100 comprises a barrier system 110 and a component assembly 105. The barrier system 110 has a first layer 120 that is interlinked to a second layer 130 to conform to the shape of the component assembly 105 and encase at least a part of the component assembly 105. More specifically, interlinking a first margin portion 123 of the first layer 120 and a second margin portion 133 of the second layer 130 creates the barrier system 110.

The first layer 120 and the second layer 130 may work together to prevent damage that each layer alone may not prevent. For example, if something impacts the outer surface of the barrier system 135, the second layer 130 will accept the blow and damage while the first layer 120 will absorb vibrations and movement of the second layer 130 into the first layer 120.

The first layer 120 may be adapted to surround the component and protect the component from environmental damage due to moisture, dirt, dust, debris, diesel fuel, vibration, oil, etc. The second layer 130 may be structured and arranged to encase the first layer 120 and the component assembly 105 to protect the component assembly 105 from physical damage due to handling, impacts, or other damage that the first layer 120 cannot protect. At the same time, the second layer 130 may be required to withstand the same environmental problems as the first layer 120 such that the second layer 130 does not break down and become less resilient to physical damage. By interlinking these layers at the first margin portion 123 and the second margin portion 133, these layers create a barrier system that gives dual functionality protection at a low cost. Proper material selection contributes to this low cost and allows the molding and curing of the layers to be performed in a single operation.

The present disclosure provides an improved system and method for encapsulating and protecting a component assembly 105 from environmental and physical damage. This barrier system 110 serves to protect the component assembly 105 from physical impacts and harsh environments that can result in damage. The barrier system 110 has greater impact strength than many competing enclosures while at the same time providing excellent resistance to vibration, moisture, and debris.

Embodiments of the present disclosure are applicable to a number of situations where electronic components are susceptible to a number of severe environments or physical situations. In potential applications of the component protection package 100, it may be beneficial to place component assemblies 105, such as sensors, monitors, and the like in severe environments, such as in the oil pan of an engine, in a fuel tank, in underwater applications, in areas with high rates of corrosion, and the like. In other potential applications, the component protection package 100 may be placed in areas that may be subject to physical abuse, such as where high vibration levels exist, on machines, on machine implements, and the like. For example, as shown in FIG. 6, component protection package 100 may be attached to an item 99 such as a machine, a machine implement, a piece of equipment, an equipment attachment, a part, a container, and the like.

In a number of industries, communications may be necessary and preferably done by wireless communication means, such as by satellite, cellular, and other radio frequency technologies. The use of RFID devices is important to monitor and track thousands upon thousands of items being moved around. The railroad industry utilizes RFID devices to track railroad cars. Rental stores use RFID devices to track equipment or parts that are being rented out. A variety of machines use RFID devices to monitor which attachment or other serviceable part may be connected and the number of hours on that attachment or other serviceable part. These RFID devices may be placed on items in locations that cannot always be protected from severe environments or from physical damage. Frequent damage does occur and results in lost parts and equipment. Various embodiments of the present disclosure are readily capable of dealing with this problem in a much more economical and easy way than what is currently being used in the industry to protect these sensitive RFID devices. Not only does this apply to RFID devices, but also to any type of component, electrical or otherwise, used in potentially severe environments or physical situations.

It will be apparent to those skilled in the art that various modifications and variations can be made in the system and method of the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

What is claimed is:

1. An apparatus for providing a radio frequency identification (RFID), comprising:
    a RFID device; and
    a barrier system adapted to encase at least a portion of the RFID device, the barrier system including:
    a first layer defining a first set of physical properties and including a first margin portion; and
    a second layer defining a second set of physical properties and including a second margin portion, the first margin portion being interlinked to the second margin portion to form a continuous transitory material, wherein the first layer and the second layer utilize a similar base elastomer with a compatible cross-linking agent.

2. The apparatus as set forth in claim 1, wherein the RFID device is configured to transmit a radio frequency signal transparently through the barrier system.

3. The apparatus as set forth in claim 1, wherein the first layer is generally pliable and the second layer is generally rigid such that the first layer and the second layer may be structured and arranged to encase the RFID device.

4. The apparatus as set forth in claim 1, wherein the first layer is generally rigid and the second layer is generally pliable such that the first layer and the second layer may be structured and arranged to encase the RFID device.

5. The apparatus as set forth in claim 1, wherein the cross-linking agent is peroxide based.

6. The apparatus as set forth in claim 1, wherein the first layer is compounded for a low stiffness, lower than the second layer, and the second layer is compounded for a high stiffness, higher than the first layer.

7. The apparatus as set forth in claim 6, where the first layer has a Shore A hardness between 25 and 60, and the second layer has a Shore D hardness between 35 and 80.

8. The apparatus as set forth in claim 6, wherein the second layer comprises:
    an elastomer, the elastomer having the same base elastomer as the first layer; and
    a thermoplastic, the thermoplastic having a glass transition temperature below a cross-linking temperature of the first layer and the second layer, the thermoplastic having a glass transition temperature below a desired maximum processing temperature.

9. The apparatus as set forth in claim 8, where the thermoplastic comprises a one of, but not limited to thermoplastic epoxy, amorphous polyamide, styrenic, cellulosic, and non-crystalline polyester.

10. The apparatus as set forth in claim 1, wherein the structure of the RFID device adds rigidity and strength to the barrier system.

11. A method for manufacturing an apparatus for providing a radio frequency identification (RFID), comprising:
    constructing a RFID device configured to transmit a radio frequency transparently;
    arranging a barrier system around the RFID device to encase at least a portion of the RFID device, the barrier system including a first layer defining a first set of physical properties and a second layer defining a second set of physical properties, wherein the first layer and the second layer utilize a similar base elastomer with a compatible cross-linking agent;
    interlinking the first layer with the second layer to form a continuous transitory material therebetween; and
    causing the first layer and the second layer to conform to the shape of the RFID device.

12. The method as set forth in claim 11, wherein interlinking the first layer with the second layer includes forming a continuous transitory material at a first margin portion of the first layer and a second margin portion of the second layer.

13. The method as set forth in claim 12, wherein interlinking the first layer with the second layer includes molding and curing the first layer and the second layer around the RFID device.

14. The method as set forth in claim 13, wherein molding and curing the first layer and the second layer around the RFID device includes performing the molding and the curing in a single operation.

15. The method as set forth in claim 14, wherein molding and curing includes applying at least one of heat and pressure.

16. The method as set forth in claim 11, wherein selecting base elastomers with a compatible cross-linking agent includes selecting a peroxide based cross-linking agent.

17. The method as set forth in claim 11, wherein interlinking the first layer with the second layer includes:
compounding the first layer for a low stiffness, lower than the second layer; and
compounding the second layer for a high stiffness, higher than the first layer.

18. The method as set forth in claim 17, wherein compounding the first layer for the low stiffness and compounding the second layer for the high stiffness includes:
causing the first layer to have a Shore A hardness between 25 and 60; and
causing the second layer to have a Shore D hardness between 35 and 80.

19. The method as set forth in claim 17, wherein compounding the second layer for the high stiffness includes:
selecting an elastomer having the same base elastomer as the first layer, and
selecting a thermoplastic having a glass transition temperature below a cross-linking temperature of the first layer and the second layer, the thermoplastic having a glass transition temperature below a desired maximum processing temperature.

20. The method as set forth in claim 19, wherein selecting the thermoplastic includes selecting a one of thermoplastic epoxy, amorphous polyamide, styrenic, cellulosic, and non-crystalline polyester.

21. The method as set forth in claim 11, wherein interlinking the first layer with the second layer includes:
compounding the first layer for a high stiffness, higher than the second layer; and
compounding the second layer for a low stiffness, lower than the first layer.

22. A method for protecting a radio frequency identification (RFID) device from environmental and physical impact, comprising:
compounding a first layer for a first set of physical properties including a stiffness;
compounding a second layer for a second set of physical properties including a stiffness higher than the stiffness of the first layer;
arranging a barrier system around the RFID device to encase at least a portion of the RFID device, wherein the first layer and the second layer utilize a similar base elastomer with a compatible cross-linking agent;
interlinking the first layer with the second layer to form a continuous transitory material therebetween; and
causing the first layer and the second layer to conform to the shape of the RFID device.

23. The method as set forth in claim 22, wherein interlinking the first layer with the second layer includes forming a continuous transitory material at a first margin portion of the first layer and a second margin portion of the second layer.

24. The method as set forth in claim 23, wherein interlinking the first layer with the second layer includes molding and curing the first layer and the second layer around the RFID device.

25. The method as set forth in claim 24, wherein molding and curing the first layer and the second layer around the RFID device includes performing the molding and the curing in a single operation.

26. An item having a radio frequency identification (RFID) device attached, the RFID device comprising:
a barrier system adapted to encase at least a portion of the RFID device, wherein the barrier system includes:
a first layer defining a first set of physical properties and including a first margin portion; and
a second layer defining a second set of physical properties and including a second margin portion, wherein the first layer and the second layer utilize a similar base elastomer with a compatible cross-linking agent, the second layer further including a thermoplastic, the thermoplastic having a glass transition temperature below a cross-linking temperature of the first layer and the second layer, the thermoplastic having a glass transition temperature below a desired maximum processing temperature, the first margin portion being interlinked to the second margin portion to form a continuous transitory material, wherein the first set of physical properties is different than the second set of physical properties, where the first set of physical properties includes a stiffness lower than a stiffness the second set of physical properties.

27. The method as set forth in claim 26, wherein the item is a machine.

28. The method as set forth in claim 26, wherein the item is a part.

29. The method as set forth in claim 26, wherein the item is an attachment on a machine.

* * * * *